United States Patent [19]

Elwood

[11] Patent Number: 4,889,410

[45] Date of Patent: Dec. 26, 1989

[54] MAGENTA FILTERS

[75] Inventor: James K. Elwood, Victor, N.Y.

[73] Assignee: Eastman Kodak Company, Rochester, N.Y.

[21] Appl. No.: 240,326

[22] Filed: Sep. 6, 1988

[51] Int. Cl.[4] .......................... G02B 5/22; G03C 1/02
[52] U.S. Cl. ....................................... 350/317; 430/7; 430/581
[58] Field of Search ............... 350/317, 311, 313, 316, 350/166; 250/226; 430/6, 7, 8, 581; 544/345; 546/7; 548/159, 181

[56] References Cited

U.S. PATENT DOCUMENTS

| | | | |
|---|---|---|---|
| 3,501,311 | 3/1970 | Lincoln et al. | 96/106 |
| 4,025,347 | 5/1977 | Beretta et al. | 430/581 |
| 4,081,277 | 3/1978 | Brault et al. | 250/226 |
| 4,108,667 | 8/1978 | Chapman | 430/581 |
| 4,355,087 | 10/1982 | Martin | 430/7 |
| 4,357,415 | 11/1982 | Hartman | 430/7 |
| 4,395,629 | 7/1983 | Sasano et al. | 350/166 |
| 4,764,670 | 8/1988 | Pace et al. | 250/226 |

FOREIGN PATENT DOCUMENTS 0013257 6/1983 European Pat. Off. .

Primary Examiner—Bruce Y. Arnold
Assistant Examiner—Loha Ben
Attorney, Agent, or Firm—Paul L. Marshall

[57] ABSTRACT

Magenta filters are disclosed which comprise an indolocarbocyanine dye in which the 3-carbon atom of each indole nucleus has bonded thereto at least one alkyl group which has from 3 to 12 carbon atoms and which is unbranched at the first carbon atom thereof. Also disclosed are color filter arrays comprising sets of differently colored filters wherein one set of filters comprises such an indolocarbocyanine dye, and light sensing semiconductor devices comprising such color filter arrays.

15 Claims, No Drawings

MAGENTA FILTERS

This invention relates to magenta filters, color filter arrays containing magenta filters, and to light sensing semiconductor devices which include such color filter arrays.

Magenta (green absorbing) filter dyes have long been used for scientific purposes and in conventional photographic processes and systems. More recently, magenta filter dyes have been used in color filter arrays on light sensing semiconductor devices. Such devices have an array of light sensing pixels in a semiconductive substrate, and an overlying color filter array which contains two or more sets of colored filters. The colored filters control the radiation which strikes the light sensing pixels. Devices of this type, which employ magenta filter dyes in the color filter array, are described by Pace et al U.S. Pat. No. 4,764,670, issued Aug. 16, 1988. Such magenta filter dyes should absorb very little blue or red light and should exhibit excellent stability to light. Certain magenta 3,3,3′,3′-tetramethylindolocarbocyanine dyes suggested by Pace et al exhibit the desired low absorption of blue and red light. Although the light stability of these dyes is acceptable, it would be desirable to provide magenta filter dyes, for color filter arrays and other purposes, which have improved light stability and which retain the desired general absorption characteristics of the 3,3,3′,3′-tetramethylindolocarbocyanine dyes.

In accordance with the present invention, magenta dyes for color filters and for color filter arrays are employed which possess the desired low absorption of blue and red light, and which exhibit improved light stability. The subject magenta dyes comprise an indolocarbocyanine dye in which the 3-carbon atom of each indole nucleus has bonded thereto at least one alkyl group which has from 3 to 12 carbon atoms and which is unbranched at the first carbon atom thereof. (As used herein the "first" carbon atom is the carbon atom attached to the indole ring.)

In one aspect, this invention provides an improvement in a color filter array comprising sets of differently colored filters, wherein one set of colored filters comprises an indolocarbocyanine dye in which the 3-carbon atom of each indole nucleus has bonded thereto at least one alkyl group which has from 3 to 12 carbon atoms and which is unbranched at the first carbon atom thereof.

In another aspect of this invention there is provided a light sensing semiconductor device including an array of light sensing pixels each less than $1 \times 10^{-8}$ m² in area comprised of a semiconductor substrate including a light sensing portion in each pixel area and a filter array for directing light to said semiconductive substrate comprised of interlaid sets of differently colored filters, each filter overlying one pixel, and at least one set of filters which comprise an indolocarbocyanine dye in which the 3-carbon atom of each indole nucleus has bonded thereto at least one alkyl group which has from 3 to 12 carbon atoms and which is unbranched at the first carbon atom thereof.

This invention also relates to filter compositions containing the indolocarbocyanine dyes described herein. Such compositions preferably comprise hydrophilic colloid and a mordant. The dyes preferably are deaggregated. The composition may contain a singlet oxygen quencher. Advantageously, such filter compositions are coated on a suitable support, preferably a transparent support such as glass, a polyester film or a cellulose ester film. The filter compositions of this invention can be used in light sensitive photographic elements, including those containing light sensitive silver halide grains. A particularly useful class of indolocarbocyanine dyes is represented by the following structural formula:

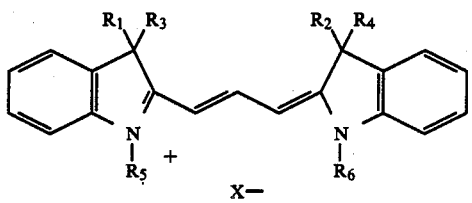

wherein $R_1$, $R_2$, $R_3$ and $R_4$ each represents an alkyl group of from 1 to 12 carbom atoms, such as methyl, ethyl, propyl, hexyl, octyl, decyl and dodecyl provided, however, that at least one of $R_1$ and $R_3$ and at least one of $R_2$ and $R_4$ represent an alkyl group and which has from 3 to 12 carbon atoms and which is unbranched at the first carbon atom thereof, and preferably is n-propyl, n-butyl, i-butyl or i-pentyl; $R_5$ and $R_6$ represent an optionally substituted alkyl group of 1 to 12 carbon atoms, e.g., methyl, ethyl, propyl, isopropyl, butyl, hexyl, cyclohexyl, decyl, dodecyl, etc., an alkoxyalkyl group, e.g. β-methoxyethyl, ω-butoxybutyl, etc., a hydroxyalkyl group, e.g., β-hydroxyethyl, ω-hydroxybutyl, etc., a carboxyalkyl group, e.g., β-carboxyethyl, ω-carboxybutyl, etc., a sulfoalkyl group, e.g., β-sulfoethyl, γ-sulfobutyl, ω-sulfobutyl, etc., a sulfatoalkyl group, e.g., β-sulfatoethyl, ω-sulfatobutyl, etc., an acyloxyalkyl group, e.g., β-acetoxyethyl, γ-propionyloxypropyl, ω-butyryloxybutyl, etc., an alkoxycarbonylalkyl, e.g., βmethoxycarbonylethyl, ω-methoxycarbonylbutyl, etc., and the like, or an alkenyl group, e.g., allyl, 1-propenyl, 2-butenyl, etc., or an aryl group, e.g., phenyl, tolyl, xylyl, chlorophenyl, methoxyphenyl, naphthyl, etc., and the like; and X represents an acid anion, e.g., chloride, bromide, iodide, thiocyanate, sulfamate, perchlorate, p-toluenesulfonate, methyl sulfate, ethyl sulfate, etc., which acid anion may be incorporated in said $R_5$ or $R_6$ groups.

A preferred color filter composition comprises an anionic indolocarbocyanine dye of the type described herein together with a hydrophilic colloid, a cationic mordant and an anionic singlet oxygen quencher. Also highly useful are color filter compositions which comprise cationic indolocarbocyanine dyes of the type described herein together with a hydrophilic colloid, an anionic mordant and a cationic singlet oxygen quencher.

Advantageously the magenta indolocarbocyanine dyes in the filters of this invention are in their deaggregated form. Dye aggregation, accompanied by increased light fading, has been observed with some (but not all) mordants when used without a hydrophilic colloid. The subject dyes can easily be deaggregated by any conventional means, such as treatment with an aqueous solution of deaggregating salt, such as sodium p-toluenesulfonate. Accordingly, one preferred embodiment of this invention features filter compositions containing deaggregated indolocarbocyanine dyes as described herein in combination with a deaggregating salt.

A variety of alternative semiconductor image sensor constructions compatible with the filters of this invention are known in the art. Bayer U.S. Pat. No. 3,971,065 particularly illustrates the relationship of filter constructions to image sensing. Murakoshi U.S. Pat. No. 4,455,575 illustrates sensors employing photodiodes in combination with CCD's. Ishihara U.S. Pat. No. 4,322,753 illustrates P well constructions for image sensors. Weiss U.S. Pat. No. 4,694,185 discloses details of preferred lens constructions.

The dye containing filter layers of the invention can take varied forms, depending upon materials and procedures chosen for their construction. In a specifically preferred fabrication approach photopatterned filter layers are first formed by coating uniform layers, imagewise exposing, washing off unexposed layer portions, and then dying the remaining filter layer by dye imbibition.

In one of the simpler approaches to forming filter layers by a photopatterning, dye imbibition process, hydrophilic colloids can be suspended in water along with a radiation responsive hardening (i.e., crosslinking) agent to form photopatterned filter layers. Suitable hydrophilic colloids include substances such as proteins, protein derivatives, cellulose derivatives, and polysaccharides, more specifically, cellulose esters, gelatin—e.g. alkali treated gelatin (cattle bone or hide gelatin) or acid treated gelatin (pigskin gelatin), gelatin derivatives—e.g., acetylated gelatin and phthalated gelatin, dextran, gum arabic, zein, casein, pectin, collagen derivatives, collodion, agar-agar, arrow-root, and albumin, all generally known to be useful as binders in photographic elements, as illustrated by *Research Disclosure*, Vol. 176, December 1987, Item 17643. *Research Disclosure* is published by Kenneth Mason Publications, Ltd., Emsworth, Hampshire P010 7Dd, England.

The hydrophilic colloid, preferably gelatin or a gelatin derivative, can be conveniently employed in combination with a dichromate salt, which is a radiation responsive hardening agent. The dichromate salt is, for example, potassium, sodium or ammonium dichromate. Dichromated gelatin has sufficient resolution for the filter elements of the color filter arrays for solid state imaging devices. It adheres well and is conveniently coated and developed using water solutions. For a fuller description of the use of dichromated gelatin as the radiation sensitive dyeable wash-off composition, reference is made to Land U.S. Pat. No. 3,284,208; Idelson U.S. Pat. No. 3,730,725; Fielding et al U.S. Pat. No. 3,925,082; and Chapter 13 of Friedman et al, "History of Color Photography," 1944, pp. 147-172. Gelatin and related hydrophilic colloids are known to exhibit some capacity for mordanting cationic dyes. Thus, relatively simple filter layer constructions are possible. As noted below, conventional mordants can be employed in combination with hydrophilic colloids.

For the most precise filter layer boundary definitions it is preferred to employ photoinsolubilizable polymers, commonly referred to as negative working photoresists. Further, to enhance dye immobilization within the filter layers, it is specifically preferred to incorporate a mordant within the photoresist coating composition.

Diazo resins are the preferred photoresponsive polymers for forming the filter layers. Many water soluble radiation sensitive diazo resins are useful. Particularly preferred are low molecular weight diazo resins which are acid condensation products of a diazonium salts of p-aminodiphenylamine, such as diphenylamine-4-diazonium halide or diphenylamine-4-diazonium phosphate, condensed in acid with aldehydes such as paraformaldehyde or formaldehyde and converted to a double metal salt, such as chlorozincate or fluoroborate. These resins are well known in the art and are described, for example, by Kosar, *Light Sensitive Systems*, pp. 323-324, John Wiley and Sons, NY, NY (1965). One particularly suitable diazo resin composition is the composition described in "Continuous-Tone Dyed Diazo Imaging Elements," *Research Disclosure*, Column 169, Item 16976, May 1978.

The diazo resin is mixed with a mordant to produce a photopatternable coating composition employed to form the filter layers. A variety of mordants are known which are entirely compatible with the formation of a photopatterned layer by the diazo resin. Useful mordants can be selected from among those disclosed by Sprague et al U.S. Pat. No. 2,548,564; Weyerts U.S. Pat. No. 2,548,575; Carroll et al U.S. Pat. No. 2,675,316; Yutzy et al U.S. Pat. No. 2,713,305; Saunders et al U.S. Pat. No. 2,756,149; Reynolds et al U.S. Pat. No. 2,768,078; Gray et al U.S. Pat. No. 2,839,401; Minsk U.S. Pat. Nos. 2,882,156 and 2,945,006; Whitmore et al U.S. Pat. No. 2,940,849; Condax U.S. Pat. No. 2,952,566; Mader et al U.S. Pat. No. 3,016,306; Minsk et al U.S. Pat. Nos. 3,048,487 and 3,184,309; Bush U.S. Pat. No. 3,271,147; Whitmore U.S. Pat. No. 3,271,148; Jones et al U.S. Pat. No. 3,282,699; Wolf et al U.S. Pat. No. 3,408,193; Cohen et al U.S. Pat. Nos. 3,488,706, 3,557,066, 3,625,694, 3,709,690, 3,758,445, 3,788,855, 3,898,088, and 3,944,424; Cohen U.S. Pat. No. 3,639,357; Taylor U.S. Pat. No. 3,770,439; Campbell et al U.S. Pat. No. 3,958,995; *Research Disclosure*, Vol. 120, April 1974, Item 12045; and *Research Disclosure*, Item 16976, cited above.

Cationic mordants are used when the dye is an anionic dye (e.g., when $R_5$ and $R_6$ in the above formula are anionic groups, such as sulfoalkyl). Anionic mordants are employed when the dye is cationic (e.g., $R_5$ and $R_6$ in the above formulas are simple alkyl groups). Particularly preferred mordants are vinylbenzyl quaternary ammonium polymeric mordants which comprise a repeating unit which conforms to the structure:

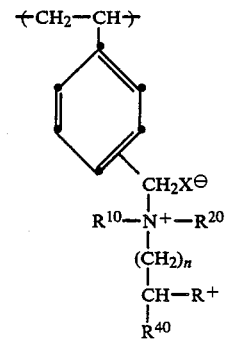

wherein:

$R^{10}$ and $R^{20}$ are the same or different and are aryl, aralkyl or alkaryl having from 6 to about 20 carbon atoms or an alkyl group having from 1 to about 10 carbon atoms;

$R^{30}$ and $R^{40}$ are either both hydrogen or, together with the carbon atom to which they are attached, form a saturated, unsaturated or aromatic ring or ring system containing from 5 to 10 carbon atoms such as cyclohexyl, cyclopentyl, phenyl, and naphthyl;

X is an anion, such as halide, e.g., chloride; methosulfate; or p-toluene sulfonate; and n is 0, 1 or 2.

Where the mordant is a copolymer, the remainder of the polymeric mordant is not critical. Many ethylenically unsaturated monomers can be copolymerized with the vinylbenzene quaternary ammonium monomers to produce satisfactory mordants. Vinylene benzenes—e.g., styrene—are preferred ethyleneically unsaturated monomers for incorporation in the mordant copolymers. The quaternary ammonium containing repeating units usually comprise between 10 and 100, preferably 40 to 100 mole percent of the polymeric mordant.

Exemplary preferred cationic mordants are listed in Table I.

TABLE I

M-1 Poly(styrene-co-3-maleimidopropyl-N,N—dimethyl-N—benzyl ammonium chloride) (1:1)
M-2 Poly(N—vinylbenzyl-N,N—dimethyl-N—allyl ammonium chloride)
M-3 Poly(vinylimidazole)
M-4 Poly(N—vinylbenzyl-N,N—dimethyl-N—propargyl ammonium bromide)
M-5 Poly(styrene-co-N—vinylbenzyl-N,N—dimethyl-N—allyl ammonium chloride (1:1)
M-6 Poly(vinyl pyridinium acetate chloride)
M-7 Poly(N—vinylbenzyl-N,N—dimethyl-N—propyl ammonium bromide)
M-8 Poly(N—vinylbenzyl-N,N,N—triethyl ammonium chloride)
M-9 Poly(N—vinylbenzyl-N,N—dimethyl-N—propargyl ammonium chloride)
M-10 Poly(N—vinylbenzyl-N,N,N—trimethyl ammonium chloride-co-ethylene glycol dimethyl-acrylate) (93:7)
M-11 Poly(N—vinylbenzyl-N,N—dimethyl-N—allyl ammonium bromide-co-divinylbenzene) (95:5)
M-12 Poly(styrene-co-N—vinylbenzyl-N,N—dimethyl-N—allyl ammonium bromide-co-divinylbenzene) (49:49:2)
M-13 Poly(N—vinylbenzyl-N,N—dimethyl-N—2-butenyl ammonium chloride)
M-14 Poly(styrene-co-N—vinylbenzyl-N,N—dimethyl-N—allyl ammonium chloride) (1:4)
M-15 Poly(styrene-co-N—vinylbenzyl-N,N,N—trimethyl ammonium chloride) (1:1)
M-16 Poly(styrene-co-N—acrylamidopropyl-N—benzyl-N,N—dimethyl ammonium chloride) (1:1)
M-17 Poly(N—vinylbenzyl-N—benzyl-N,N—dimethyl ammonium chloride)
M-18 Poly(styrene-co-N—vinylbenzyl-N,N—dimethyl-N—butyl ammonium chloride) (1:1)
M-19 Poly(1-vinylimidazole-co-1-vinyl-3-benzyl-imidazolium chloride) (1:1)
M-20 Poly(1-methyl-2-methyl-5-vinyl pyridinium-p-toluenesulfonate)
M-21 Poly(1-benzyl-4-vinyl pyridinium chloride)
M-22 Poly(1-benzyl-2-methyl-5-vinyl pyridinium chloride)
M-23 Poly(N—vinylbenzyl-N,N—dimethyl-N—carbamyl-methyl ammonium chloride)
M-24 Poly(N—vinylbenzyl-N,N—dimethyl-N—cyclohexyl ammonium chloride)
M-25 Poly[N—vinylbenzyl-N,N—dimethyl-N—(3-methyl-2-butenyl) ammonium chloride]
M-26 Poly(styrene-co-N—vinylbenzyl-N,N,N—trimethyl ammonium chloride) (1:2)
M-27 Poly(N—vinylbenzyl-N,N—dimethyl-N—isobutyl ammonium chloride)
M-28 Poly[N—(2-acrylamido-1,1-dimethylpropyl-N,N—dimethyl-N—benzyl ammonium chloride]
M-29 Poly(N,N,N—trimethyl-N—vinylbenzyl ammonium chloride)
M-30 Poly[styrene-co-benzyl(dimethyl)-p-vinyl-benzyl ammonium chloride]
M-31 Poly(P,P,P-trioctyl-P-vinylbenzylphosphonium chloride)
M-32 Poly(styrene-co-N—vinylbenzyl-N,N,N—trihexyl ammonium chloride)
M-33 Poly(N,N,N—trimethyl-N—vinylbenzyl ammonium-co-styrene)

TABLE I-continued

M-34 Poly(styrene-co-N—vinylbenzyl-N,N—dimethyl-benzyl ammonium chloride-co-divinylbenzene)
M-35 Poly(N—vinylbenzylpiperidinium chloride)
M-36 Poly(4-vinylphenylcarbamylmethyl-N,N,N—trimethyl ammonium chloride)
M-37 Poly(N—vinylbenzyl-N,N—dimethyl-N—acetonyl ammonium chloride)
M-38 Poly(N—vinylbenzyl-N,N—dimethyl-N—methoxycarbonylmethyl ammonium chloride)
M-39 Poly(N—vinylbenzylpyridinium chloride)
M-40 Poly(N—vinylbenzyl-N—methylpyrrolidinium chloride)
M-41 Poly(N—vinylbenzyl-N—methylpiperidinium chloride)
M-42 Poly(N—vinylbenzyl-N—methylmorpholinium chloride)
M-43 Poly(N—vinylbenzyl-N,N—dimethyl anilinium chloride)

Corresponding anionic mordants can be prepared by substituting for the vinylbenzyl quaternary ammonium repeating units anionic repeating units derived from carboxylic acid substituted vinyl monomers, such as acrylic acid, methacrylic acid, α-chloroacrylic acid, or 1-propene-1,2,3-tricarboxylic acid.

The relative amounts of hydrophilic colloid, mordant and diazo resin depend on the molecular weight and the mordanting strength of the mordant, the particular dyes to be used to make the color filter elements of the color filter array, and other factors. A preferred range of diazo resin is from about 0.16 to about 1.0 mg/dm$^2$ of coating; a preferred range of mordant is from about 0.5 to about 5.0 mg/dm$^2$, most preferably from about 1.0 to 1.5 mg/dm$^2$; and a preferred range of hydrophilic colloid is about 0.5 to about 5.0 mg/dm$^2$ and most preferably from about 1.0 to 1.5 mg/dm$^2$. In making color filter arrays or solid state imaging devices, it is most common to coat by spin coating; however, other methods are useful. The resins are sensitive primarily to ultraviolet (UV) light and are usually processed using water such as by spraying or by immersing the layer in an agitated vessel.

Dye stability can be further enhanced by the use of a singlet oxygen quencher, such as described in Gratzel European Patent 0 013 257 or Smith U.S. Pat. No. 4,050,938 issued Sept. 27, 1977. The preferred singlet oxygen quenchers for the indolocarbocyanine dyes used herein have high efficiency and low absorption in other than the green region of the spectrum. Copper, cobalt and nickel organometallic quenching compounds provide particularly good results. Preferably anionic quenchers are employed with anionic dyes and cationic mordants; and, cationic quenchers are employed with cationic dyes and anionic mordants.

Specific useful quenchers are shown below:

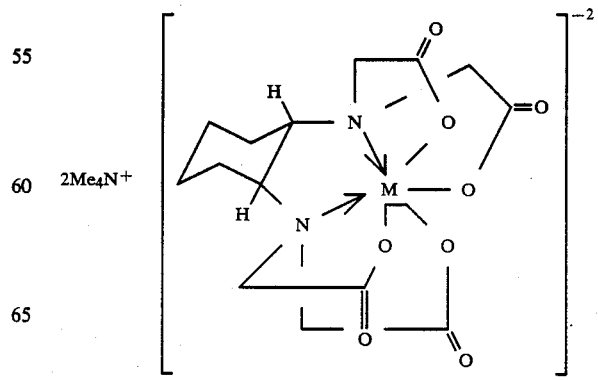

Quencher 1: M=Ni
Quencher 2: M=Co
Quencher 3: M=Cu
Quencher 4:

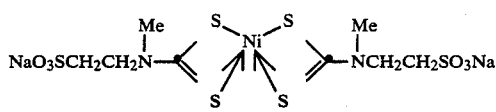

Quencher 5:

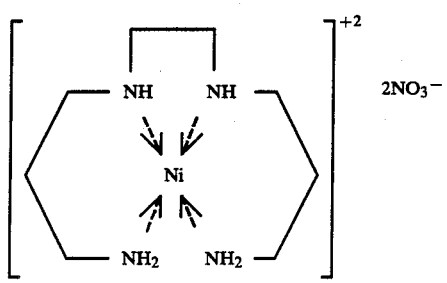

Quencher 6:

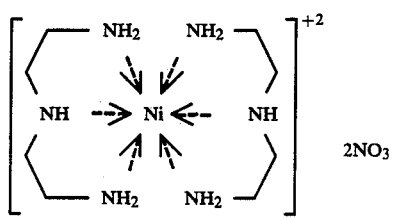

Illustrative preparations for Quenchers 1 and 5 are set out below.

Tetramethylammonium 1,2-Cyclohexylenedinitrilotetraacetatonickelate(II) (Quencher 1).

1,2-Cyclohexylenedinitrilotetraacetic acid (18.22 g) 0.05 mole) and 25% aqueous tetramethylammonium hydroxide (36.46 g, 0.01 mole) were dissolved in 400 mL of warm water and filtered. To this solution was added nickel acetate tetrahydrate (12.44 g, 0.05 mole) in 100 mL of water. This blue solution was boiled a few minutes and then evaporated to dryness with heat on a good rotary evaporator removing as much acetic acid as possible. The residue was stirred with ether and the ether decanted. The solid was scraped from the walls of the flask, filtered, and dried under vacuum at room temperature to give 29.9 g (99%) as the trihydrate. (MW 603.34)

Analysis: calculated for $C_{22}H_{42}N_4O_8Ni \cdot 3H_2O$: C, 43.8; H, 8.0; N, 9.3; Ni, 9.7. Found: C, 43.7; H, 7.6; N, 9.2; Ni, 9.6.

Electronic spectrum in water: λ-max=990 nm (ext. coef.=31.4). Literature value for the EDTA complex: λ-max=990 nm (ext. coef.=31).

Bis(diethylenetriamine)nickel(II) Nitrate (Quencher 5).

Nickel nitrate hexahydrate (8.72 g, 0.03 mole) was dissolved in 300 mL of ethanol. To this stirring solution was added diethylenetriamine (6.5 g, 0.063 mole) dropwise. When one equivalent of the ligand had been added, a blue solution resulted. As the second equivalent was added, pink product began to separate. After the addition was complete, the mixture was stirred for an additional 10 minutes and the product was filtered, washed with ethanol, and dried to give 11.5 g (98.5%). (MW 389.06)

Analysis: calculated for $C_8H_{26}N_8O_6Ni$: C, 24.7; H, 6.7; N, 28.8. Found(60°): C, 24.8; H, 6.4; N, 28.3.

Further increases in light stability can be realized by employing an overcoat, such as polyvinyl alcohol, which functions as an oxygen barrier layer.

The following examples further illustrate the invention.

The following synthetic procedures describe the preparations of the intermediates and dyes containing the i-butyl groups at the 3-positions of the indole rings. Similar procedures were used to obtain different substituents on the 3-position of the subject indolocarbocyanine dyes.

3,3-Diisobutyl-2-methyl-(3H)-indole.

Into a 2-liter, 3-necked flask fitted with a condenser with drying tube, a mechanical stirrer, and a Y-tube containing a nitrogen inlet and an addition funnel were placed magnesium turnings (24.3 g, 1 mole) and dry ether (250 mL). To this stirring mixture was added dropwise over an hour or so ethyl iodide (156 g, 1 mole) to form the Grignard reagent. When only a small amount of magnesium remained, a solution of 2-methylindole (65.6 g, 0.5 mole) in 100 mL or so of dry toluene was added dropwise over an hour to the Grignard solution. The drying tube was removed during this addition as the evolution of ethane was rather vigorous. When the addition of the 2-methylindole solution was complete, the mixture was stirred for an additional hour while heating at 80°–100° C. with an oil bath.

With the oil bath at 100° C., i-butyl bromide (137 g, 1 mole) was added dropwise to the stirring solution over an hour. During the addition of the first half of the i-butyl bromide, ethane was again evolved. During the addition of the second half, the drying tube was again placed on the condenser. At this time some magnesium salts separated. After the addition of the i-butyl bromide was complete, the oil bath temperature was increased to 125° C. and the stirring mixture was refluxed for 3–4 hours.

The reaction mixture was then transferred to a 4-liter beaker and crushed ice was added followed by water containing some acetic acid to dissolve salts and give a solution of pH 4. The entire two phase mixture was then transferred to a 4-liter separatory funnel, and the crude products were extracted three times into ether. The combined ethereal extracts containing toluene and the various indole products were then extracted 3–4 times with 3N hydrochloric acid (2 liters total volume of acid) to remove the more basic 3H-indole product from the undesired less basic 1H-indoles. The combined acid extracts were treated with a little Norit (charcoal) and filtered to remove some purple color which was present from the original 2-methylindole. The clear acid filtrate was placed in a 4-liter beaker with crushed ice and carefully made basic with 50% sodium hydroxide solution. The desired product separated as a pale yellow layer on top. After cooling to room temperature or below, the oily product was extracted into ether twice and the combined ether layers were washed once with water and dried with anhydrous magnesium sulfate. The ether was evaporated to give 62.7 g (51.5%) of crude but good 3,3-diisobutyl-2-methyl-3H-indole via NMR. The product was distilled at 100° C. under reduced pressure at 0.6 mm of Hg giving 59.2 g (48.6%) of pure product as an essentially colorless oil. (MW 243.396)

The product should be stored in a refrigerator under nitrogen as it slowly yellows in the air at room temperature.

This same product was also prepared via a Fischer Indole synthesis in which the requisite ketone was first prepared, followed by the phenylhydrazone, and finally the indole. The overall yield for this three step route was 9.5%.

3,3-Diisobutyl-1,2-dimethyl-(3H)-indolium Iodide.

3,3-Diisobutyl-2-methyl-(3H)-indole (2.43 g, 0.01 mole) and methyl iodide (3 g, excess) were heated in a flask with condenser on a steam bath for 30 min. The excess methyl iodide was evaporated, and the resulting syrup was dissolved in a small amount of methanol and diluted to 350 mL with ether while stirring in a beaker. After stirring for 20 min., the product was filtered, washed with ether, and dried to give 3.0 g (77.8%). The NMR was good. (MW 385.33)

3,3-Diisobutyl-2-formylmethylene-1-methylindole.

To 10 mL of dry dimethylformamide in a flask cooled with an ice bath was added dropwise with stirring phosphoryl chloride (1.76 g, 0.0115 mole). After a few minutes 3,3-diisobutyl-1,2-dimethyl-(3H)-indolium iodide (3.85 g, 0.01 mole) was added portionwise over 5 min. The resulting solution was allowed to stir at room temperature for at least 3 hours. This solution was then slowly poured into 250 mL of water stirring in a beaker. After a few minutes 3,3-diisobutyl-2-dimethylaminovinyl-1-methyl-(3H)-indolium iodide separated as its monohydrate via elemental analysis and NMR of a small sample which was removed. This aqueous suspension was then heated to boiling with stirring to dissolve this intermediate product giving a yellow solution with a little purple scum floating on the top. A little Norit was added and after a minute or so the solution was filtered. The yellow filtrate was made strongly basic with 20% sodium hydroxide solution and stirred with warming at 50°–60° C. for a few minutes. The formylmethylene product separated and slowly became crystalline. After cooling to room temperature, the product was filtered, washed well with water, and dried to give 2.3 g (80.6%). The IR and NMR were good. (MW 285.43)

NMR (90 MHz) in CDCl$_3$: $\xi$=10.1 (d, 1, 10 Hz) for the aldehyde proton and $\xi$=5.5 (d, 1, 10 Hz) for the methine proton.

Anhydro-3,3-diisobutyl-2-methyl-1-(3-sulfopropyl)-(3H)-indolium Hydroxide.

3,3-Diisobutyl-2-methyl-(3H)-indole (4.87 g, 0.02 mole) and propane sultone (2.93 g, 0.024 mole) in 10 mL of dry acetonitrile were refluxed for 4 days in a flask with condenser. Most of the acetonitrile was evaporated and the residue was stirred in acetone as the product crystallized. The product was filtered, washed with acetone, and dried to give 3.48 g (47.6%). Pyridine was added to the filtrate which was then allowed to stand a day to destroy excess propane sultone. The NMR was good. This reaction may also be run neat by heating at 120° C. for an hour. (MW 365.54)

Anhydro-3,3,3',3'-tetraisobutyl-1,1'-bis(3-sulfopropyl)indolocarbocyanine Hydroxide.

Anhydro-3,3-diisobutyl-2-methyl-1-(3-sulfopropyl)-(3H)-indolium hydroxide (1.1 g, 3 mmoles), diethoxymethyl acetate (4 mL, excess), triethylamine (1 mL), and dry pyridine (20 mL) were heated to boiling with stirring in a small beaker covered with a watch glass. The boiling was continued for 5 min allowing approximately half the pyridine to boil off. This dye solution was then added to 300 mL of stirring water in a beaker to give a reddish-magenta solution. The solution was filtered from any traces of solid, and the stirring filtrate was slowly acidified with hydrochloric acid to a pH of 0–1 as the dye separated as a very fine shiny grey solid. After stirring for an hour, the dye was filtered using a fine sintered glass funnel (350 mL). The dye was washed on the funnel two or three times with small amounts of water until the filtrate came through nearly colorless instead of yellow. This required several hours of filtering. The dye was then dried overnight in a vacuum oven at 100° while on the funnel. The dye was then easily removed as a thin disk to give 0.90 g (81%) pure via thin layer chromatography (MW 741.07)

This procedure has been scaled up in a 0.02 mole run to give a yield of 90%.

3,3,3',3'-Tetraisobutyl-1,1'-dimethylindolocarbocyanine Iodide.

3,3-Diisobutyl-1,2-dimethyl-(3H)-indolium iodide (11.56 g, 0.03 mole) and diethoxymethyl acetate (50 mL) were combined and heated with stirring at 80°–90° C. for 90 min. The reaction mixture was washed from the beaker into a round bottom flask with a little methanol and evaporated as much as possible on a rotary evaporator in a near boiling water bath. The resulting thick mixture was dissolved in a little methanol and slowly added to 1 liter of water stirring in a beaker. To the resulting milky red mixture was added a solution of several grams of sodium iodide in a little water. After 15 min of stirring, the crude dye was filtered, washed with water, and dried to give 9.17 g of solids. The NMR suggested that this solid consisted of a mixture of the desired dye along with the formylmethylene intermediate. The solid mixture and 150 mL of toluene in a 1 liter beaker were heated to boiling with stirring and then slowly diluted to 500 mL by the addition of ligroin 513. After cooling to room temperature and stirring for ten minutes, the dye was filtered, washed well with ligroin, and dried to give 5.88 g (60%) of dye free of the formylmethylene intermediate. (MW 652.75)

The above filtrate was evaporated to dryness, and the crude formylmethylene intermediate was recrystallized from ligroin 513 using a little Norit to give 2.62 g (30.6%) essentially pure via NMR. (NW 285.433)

3,3-Diisobutyl-3',3'-diethyl-1,1'-dimethylindolocarbocyanine Triflate.

3,3-Diethyl-1,2-dimethyl-(3H)-indolium iodide (0.33 g, 1 m mole) and 3,3-diisobutyl-2-formylmethylene-1-methylindole (0.29 g, 1 m mole) in 15 mL of acetic anhydride were boiled with stirring for several minutes. After cooling somewhat, a little methanol was added to destroy excess anhydride. This solution was then added to 400 mL of water stirring in a beaker. It was advantageous to add a little sodium iodide to aid in crystallization and separation of the dye. After stirring for 20 mn, the dye was filtered and washed with water.

The dye iodide was stirred in methanol with an excess of Amberlite IRA-400(Cl) resin for 30 mn and the beads were filtered. The treatment was repeated to insure removal of essentially all of the iodide. This methanol solution of the dye chloride was concentrated to 20 mL, diluted to 100 mL with water, and treated with an excess of triflic acid. With some warming and stirring, the dye crystallized. The dye triflate was filtered, washed with water, dried, and recrystallized from toluene/ligroin 513 to give 0.47 g (76%). MW 618.805) Using standard dye synthetic procedures, such as described above, the following indolocarbocyanine dyes were prepared:

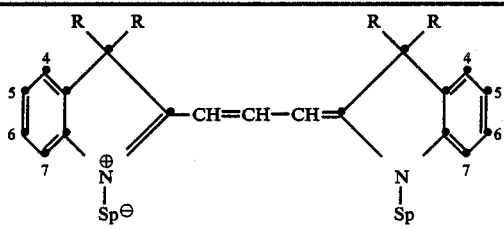

| No. | R | | MW |
|---|---|---|---|
| 1 | Me | comparison | 572.74 |
| 2 | Et | comparison | 666.94 |
| 3 | n-Pr | invention | 684.96 |
| 4 | i-Pr | comparison | 684.96 |
| 5 | n-Bu | invention | 820.16 |
| 6 | i-Bu | invention | 741.07 |
| 7 | i-Pe | invention | 876.27 |
| 8 | CyHex | comparison | 652.88 |
| 9 | 2-Etbu | invention | 853.28 |
| 10 | Benzyl | comparison | 956.23 |
| 11 | EtOEt— | comparison | 779.03 |
| 12 | Allyl | comparison | 714.99 |
| 13 | Et,i-Bu | invention | 684.96 |

In the above formula, Sp refers to sulfopropyl. In the listing of dyes, Me refers to methyl; Et refers to ethyl; Pr refers to propyl; Bu refers to butyl; Pe refers to pentyl; and CyHex refers to a spirocyclohexyl substituent in which each R group in the formula is taken together to form a ring consisting of six carbon atoms.

Dye 14, 3,3,3',3'-tetraisobutyl-1,1'-dimethylindolocarbocyanine iodide was prepared using similar techniques. Dye 14 is useful in the present invention.

Light Fade Tests

Dyed strips of mordant with or without quencher, and with hydrophilic colloid, were mounted in the windows of special fading cards measuring 107×58 mm. These cards were then placed in a card holder especially designed for them which was mounted in a Perkin Elmer 552 spectrophotometer. Initial density readings at the absorption maxima were then made and recorded. After fading, the cards were again read and the percentage dye loss was calculated. To maximize reproducibility during light fade, the cards were mounted with the coated side of the strips facing the light source. Also, a special black paper backing was used behind the cards and a Wratten 2B filter (which filters out ultraviolet radiation, i.e., radiation shorter than about 400 nm) in front of them. A polyester film support was coated with an aqueous solution of gelatin and very fine particles of a cationic terpolymer mordant "A" having the following composition:

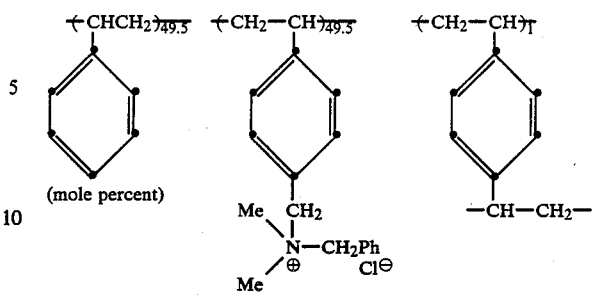

the dried coating contained 200 mg of gelatin and 200 mg of the mordant per square foot (0.093 square meter) and a dried thickness of about 5 microns. This coating was immersed in a solution of dye in methanol and water (1:1 by volume) for a sufficient period of time to obtain a density of at least about 1.0. The dyed samples were tested for fading, as described above, to 5.4 klux white radiation for one week. Two runs were made with each dye. The results are shown in Table A.

TABLE A

Percent Dye Lost in 1 Week of 5.4 klux SANS + 2B and Absorption Maxima of the Dyes

| R | Dye No. | Runs | Average | λ-max MeOH(HBW) | λ-max Mordant (HBW) |
|---|---|---|---|---|---|
| Methyl | 1 | 47.3 42.3 | 44.8% | 550(53) nm | 559(67) nm |
| Ethyl | 2 | 30.0 31.2 | 30.6 | 553(53) | 562(62) |
| n-Propyl | 3 | 25.2 25.8 | 25.5 | 553(52) | 563(62) |
| i-Propyl | 4 | 37.0 38.8 | 37.9 | 563(55) | 574(64) |
| n-Butyl | 5 | 28.8 28.0 | 28.4 | 554(52) | 565(63) |
| i-Butyl | 6 | 23.9 24.1 | 24.0 | 563(35) | 573(59) |
| i-Pentyl | 7 | 31.2 28.3 | 29.8 | 556(53) | 567(62) |
| Spiro Cyclohexyl | 8 | 44.2 47.0 | 45.6 | 557(51) | 569(62) |
| 2-Ethyl-butyl | 9 | 27.2 24.0 | 25.6 | 566(53) | 576(63) |
| Benzyl | 10 | 33.6 29.8 | 31.7 | 573(56) | 583(64) |
| Ethoxy-ethyl | 11 | 49.6 47.4 | 48.5 | 556(56) | 565(65) |
| Allyl | 12 | 36.6 37.6 | 37.1 | 561(54) | 572(62) |
| Ethyl, i-butyl | 13 | 26.1 27.1 | 26.6 | 557(53) | 568(61) |

As shown in the above table, Dyes 3, 5, 6, 7, 9 and 13, which are within the scope of the invention, showed less fading than comparison dyes 1, 2, 4, 8, 10, 11 and 12. As can be seen, larger alkyl groups give greater mordant affinity and better light stability; branching at the first carbon atom of the alkyl group reduces light stability; branching at the second carbon atom gives an appreciable bathochromic shift without adversely affecting light stability; and smaller alkyl groups (methyl and ethyl) and ether containing groups have less affinity for the mordant and reduced light stability.

The procedure used to obtain the results in Table A was repeated, except that the dyes were tested with singlet oxygen quenchers using methanol/water solutions of 1:1 (by volume) and containing $4 \times 10^{-4}$ molar solutions of dye and from 0 to about $0.75 \times 10^{-2}$ molar solutions of various quenchers giving quencher to dye ratios (Q/D) of from 0/1 to 20/1. The quenchers used are identified by number in parenthesis. Also, the samples were subjected to 50 klux white light for one week. The percentage of dye lost is shown in Table B.

TABLE B

| | | Percent Dye Lost in 1 Week of 50 klux HID + 2 B | | | | | | |
|---|---|---|---|---|---|---|---|---|
| R | No. | No Q | (3)1/1 | (3)5/1 | (3)20/1 | (4)1/1 | (4)5/1 | (4)20/1 |
| Me | 1 | 80.1% | 46.0% | 22.0% | 17.2% | 42.5% | 16.5% | — |
| Et | 2 | 72.0 | 32.7 | 12.5 | 14.5 | 22.8 | 7.3 | — |
| n-Pr | 3 | 64.9 | 32.1 | 10.6 | 7.5 | 20.1 | 6.0 | 1.8 |
| i-Pr | 4 | 75.5 | 40.7 | 21.2 | 10.8 | 24.6 | 10.7 | 3.4 |
| n-Bu | 5 | 65.3 | 33.3 | 9.3 | 11.0 | 15.3 | 4.3 | 1.4 |
| i-Bu | 6 | 61.7 | 23.8 | 5.9 | 5.4 | 17.6 | 3.8 | 1.7 |
| i-Pe | 7 | 66.5 | 37.3 | 15.7 | 8.0 | 15.4 | 5.6 | 6.3 |
| CyHex | 8 | 77.2 | 44.2 | 25.4 | 27.4 | 34.0 | 11.3 | 4.9 |
| 2-Etbu | 9 | 64.9 | 24.4 | 10.4 | 8.7 | 15.3 | 3.6 | 2.4 |
| Bz | 10 | 84.8 | 41.6 | 14.8 | 14.8 | 20.4 | 3.5 | 1.4 |
| EtOEt- | 11 | 85.6 | 47.6 | 24.1 | 14.2 | 28.0 | 22.8 | — |
| Allyl | 12 | 83.8 | 40.2 | 16.1 | 18.8 | 43.1 | 11.3 | 7.3 |
| Et,i-Bu | 13 | 63.6 | 28.9 | 10.9 | 6.6 | 17.1 | 4.6 | — |

The above data shows that singlet oxygen quenchers improve the light stability of the subject dyes, i.e., Dyes 3, 5, 6, 7, 9 and 13, and provide better light stability than comparison dyes 1, 2, 4, 8, 10, 11 and 12 without quencher and at almost all quencher/dye levels.

The procedure used to obtain the results in Table B was repeated except that cationic Dye 14 was employed, and gelatin and mordant "C", the composition of which is shown below, was substituted for cationic mordant A.

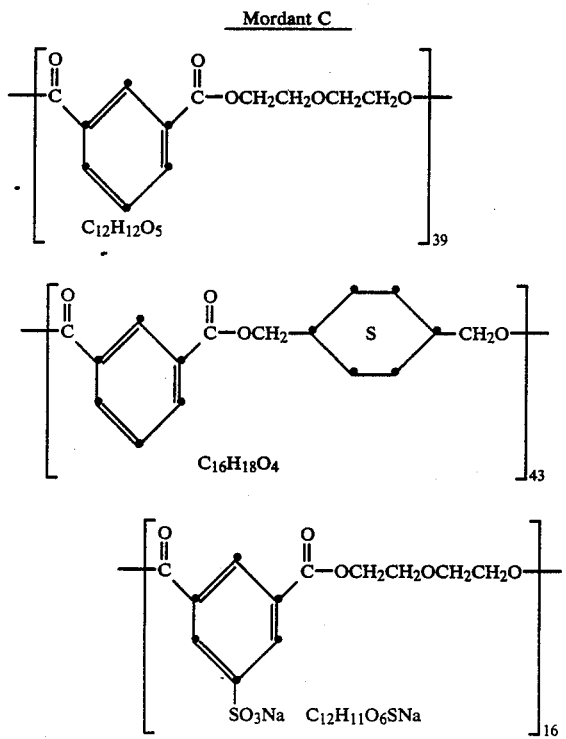

The dried coating contained about 200 mg gelatin and 200 mg mordant C per square foot (0.093 square meter) and a dried thickness of about 5 microns. The results are shown in Table C.

TABLE C

| Quencher | Quencher/Dye Level | % Dye Lost |
|---|---|---|
| None | — | 86.6% |
| 6 | 1/1 | 69.8 |
| 6 | 5/1 | 44.1 |
| 6 | 10/1 | 36.0 |
| 6 | 20/1 | 25.1 |
| 5 | 1/1 | 55.3 |
| 5 | 5/1 | 34.0 |
| 5 | 10/1 | 16.1 |
| 5 | 20/1 | 19.6 |

The use of a singlet oxygen quencher resulted in a significant improvement in the light stability of the dye.

The procedure described above was repeated using Dye 6 and the following combination of mordant and diazo resist:

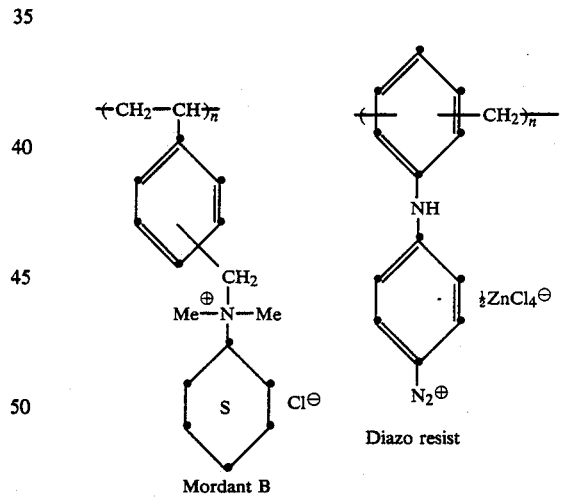

The composition was coated onto a glass substrate at a dried thickness of about 1 micron, and with a weight ratio of 3:2 Mordant B to diazo resist. The coating was dyed with Dye 6 as described above. The dye coating was subjected to the fading test described above, except that 3 klux tungsten radiation was used for a one week period. The coating showed a 34.7% loss of dye. This large dye loss was largely due to dye aggregation. When separate samples of the coating were treated with 0.2 molar solutions of the following deaggregating salts: sodium hexafluorophosphate; sodium trifluoromethanesulfonate; sodium heptafluorobutyrate; and sodium p-toluene sulfonate, dye loss, in each instance, was reduced to respectively, 12.8%; 11.7%; 14.2% and 10.7%.

Treatment with singlet oxygen quencher 3 did not further improve light stability in these deaggregated dye coatings. This example was repeated to compare the untreated dyed coating (control) with a coating deaggregated with a 0.2 molar solution of p-toluene sulfonate and another coating treated with a $4 \times 10^{-3}$ M solution of Quencher 4, with dye losses (after subjecting the coating for 10 days to the above fading test) being 36.5% for the control; 12.1% when deaggregated with the p-toluenesulfonate treatement and 5.5% when treated with Quencher 4.

For Color Filter Array (CFA) applications, a mordant was prepared in an imagewise fashion. To achieve this, the water soluble homopolymer, Mordant B shown above, was mixed with a water soluble photosensitive diazo resist polymer. This mixture was then spin coated onto silicon wafers containing charge coupled devices having light sensitive pixel areas. The resist was exposed to ultraviolet light using a mask. The filter was registered over the light sensing pixel areas as described, for example, in Horak et al U.S. Pat. No. 4,204,866 issued May 27, 1980. In the exposed areas, the diazonium groups on the resin were decomposed to phenolic and other materials and the resin became water insoluble. The exposed resist was washed with distilled water to remove the material in the unexposed areas and then the dye solution consisting of methanol/water (1:1 by volume) and $4 \times 10^{-4}$ molar solution of Dye 6 was applied to obtain a density of at least 1.0. After a predetermined time, the dye solution was spun off followed by a water wash. A one color pattern resulted. This wafer was then spin coated a second time with the mordant/resist and imaged as before with a second mask. After a water wash, a second dye was applied as before giving a two color array. This procedure was repeated a third time to give the full CFA. The mordant/resist was spin coated onto the charge coupled device to a thickness of about 1 micron and given a uniform exposure. The formulations used 3 g of Mordant B for each 2 g of the resist in water solution. At a coating thickness of 1 micron, simple calculations showed a concentration of cationic sites of 0.20 mmoles/ft$^2$ or 0.21 mmoles/1000 cm$^2$. The structures of the Mordant B and the diazo resist are given above.

The light sensing semiconductor device obtained provided excellent results; the magenta dye showed good resistance to light fading.

The invention has been described in detail with particular reference to preferred embodiments thereof, but it will be understood that variations and modifications can be effected within the spirit and scope of the invention.

What is claimed is:

1. In a color filter array comprising sets of differently colored filters, the improvement wherein one set of colored filters comprises an indolocarbocyanine dye in which the 3-carbon atom of each indole nucleus has bonded thereto at least one alkyl group which has from 3 to 12 carbon atoms and which is unbranched at the first carbon atom thereof.

2. In a color filter array comprising sets of differently colored filters, the improvement wherein one set of filters comprises a dye having the following formula:

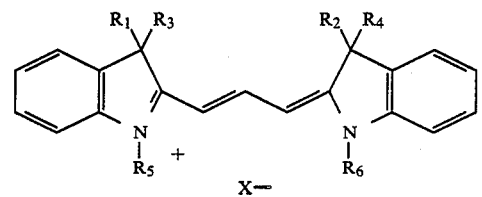

wherein $R_1$, $R_2$, $R_3$ and $R_4$ each represent an alkyl group of from 1 to 12 carbon atoms, at least one of $R_1$ and $R_3$, and at least one of $R_2$ and $R_4$ repressenting an alkyl group which has from 3 to 12 carbon atoms and which is unbranched at the first carbon atom thereof; $R_5$ and $R_6$ each represent an optionally substituted alkyl group of from 1 to 12 carbon atoms; and X represents an acid anion.

3. In a color filter array comprising sets of differently colored filters, the improvement wherein one set of color filters comprises:
an indolocarbocyanine dye in which the 3-carbon atom of each indole nucleus has bonded thereto at least one alkyl group which has from 3 to 12 carbon atoms and which is unbranched at the first carbon atom thereof;
a mordant for said indolocarbocyanine dye; and,
gelatin.

4. The color filter array of claim 3 wherein said set of filters comprising an indolocarbocyanine dye contains a quencher for singlet oxygen.

5. The color filter array of claim 3 wherein said set of filters comprising an indolocarbocyanine dye also contains a deaggregating salt.

6. In a color filter array comprising sets of differently colored filters, the improvement wherein one set of filters comprises
an anionic indolocarbocyanine dye in which the 3-carbon atom of each indole nucleus has bonded thereto at least one alkyl grou which has from 3 to 12 carbon atoms and which is unbranched at the first carbon atom thereof;
a hydrophilic colloid;
a cationic mordant; and
an anionic singlet oxygen quencher.

7. In a color filter array comprising sets of differently colored filters, the improvement wherein one set of filters comprises
a cationic indolocarbocyanine dye in which the 3-carbon atom of each indole nucleus has bonded thereto at least one alkyl group which has from 3 to 12 carbon atoms and which is unbranched at the first carbon atom thereof;
a hydrophilic colloid;
an anionic mordant; and
a cationic singlet oxygen quencher.

8. In a color filter array comprising sets of differently colored filters, the improvement wherein one set of filters comprises
a deaggregated indolocarbocyanine dye in which the 3-carbon atom of each indole nucleus has bonded thereto at least one alkyl group which has from 3 to 12 carbon atoms and which is unbranched at the first carbon atom thereof;
a mordant for said dye; and,
a deaggregating salt for said dye.

9. In a light sensing semiconductor device including an array of light sensing pixels each less than $1 \times 10^{-8}$ m$^2$ in area comprised of
 a semiconductive substrate including a light sensing portion in each pixel area and
 a filter array for directing light to said semiconductive substrate comprised of interlaid sets of differently colored filters, each filter overlying one pixel,
 the improvement wherein
 at least one set of filters comprises an indolocarbocyanine dye in which the 3-carbon atom of each indole nucleus has bonded thereto at least one alkyl group which has from 3 to 12 carbon atoms and which is unbranched at the first carbon atom thereof.

10. In a light sensing semiconductor device including an array of light sensing pixels each less than $1 \times 10^{-8}$ m$^2$ in area comprised of
 a semiconductive substrate including a light sensing portion in each pixel area and
 a filter array for directing light to said semicoductive substrate comprised of interlaid sets of differently colored filters, each filter overlying one pixel,
 the improvement wherein
 at least one set of filters comprises a dye having the following formula:

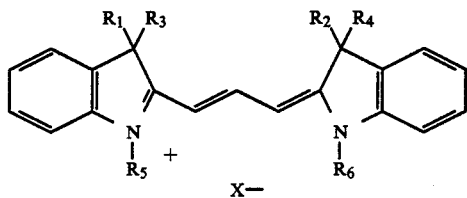

wherein $R_1$, $R_2$, $R_3$ and $R_4$ each represent an alkyl group of from 1 to 12 carbon atoms, at least one of $R_1$ and $R_3$, and at least one of $R_2$ and $R_4$ representing an alkyl group which has from 3 to 12 carbon atoms and which is unbranched at the first carbon atom thereof; $R_5$ and $R_6$ each represent an optionally substituted alkyl group of from 1 to 12 carbon atoms; and X represents an acid anion.

11. In a light sensing semiconductor device including an array of light sensing pixels each less than $1 \times 10^{-8}$ m$^2$ in area comprised of
 a semiconductive substrate including a light sensing portion in each pixel area and
 a filter array for directing light to said semiconductive substrate comprised of interlaid sets of differently colored filters, each filter overlying one pixel,
 the improvement wherein
 at least one set of filters comprises a 3,3,3',3'-tetraisobutylindolocarbocyanine dye.

12. A filter composition comprising a hydrophilic colloid, a mordant, and an indolocarbocyanine dye in which the 3-carbon atom of each indole nucleus has bonded thereto at least one alkyl group which has from 3 to 12 carbon atoms and which is unbranched at the first carbon atom thereof.

13. A filter composition in accordance with claim 12 which contains a quencher for singlet oxygen.

14. A filter composition in accordance with claim 12 in which the indolocarbocyanine dye is deaggregated and which composition contains a deaggregating salt.

15. A filter composition comprising an indolocarbocyanine dye in which the 3-carbon atom of each indole nucleus has bonded thereto at least one alkyl group which has from 3 to 12 carbon atoms and which is unbranched at the first carbon atom thereof.

* * * * *